US008237050B2

(12) United States Patent
Hinsch et al.

(10) Patent No.: US 8,237,050 B2
(45) Date of Patent: Aug. 7, 2012

(54) SOLAR CELL WITH ORGANIC MATERIAL IN THE PHOTOVOLTAIC LAYER AND METHOD FOR THE PRODUCTION THEREOF

(75) Inventors: Andreas Hinsch, Freiburg (DE); Andreas Georg, Freiburg (DE); Michael Niggemann, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 1660 days.

(21) Appl. No.: 10/495,134

(22) PCT Filed: Nov. 2, 2002

(86) PCT No.: PCT/EP02/12241
§ 371 (c)(1),
(2), (4) Date: Nov. 15, 2004

(87) PCT Pub. No.: WO03/043100
PCT Pub. Date: May 22, 2003

(65) Prior Publication Data
US 2005/0098203 A1 May 12, 2005

(30) Foreign Application Priority Data
Nov. 10, 2001 (DE) .................................. 101 55 346

(51) Int. Cl.
*H01L 31/00* (2006.01)
(52) U.S. Cl. ........................................................ 136/263
(58) Field of Classification Search .................. 136/243, 136/263
See application file for complete search history.

(56) References Cited

U.S. PATENT DOCUMENTS

| 3,903,427 | A | * | 9/1975 | Pack ........................... 250/208.2 |
| 4,556,816 | A | * | 12/1985 | Imamura et al. ............... 313/366 |
| 5,220,181 | A | * | 6/1993 | Kanai et al. ..................... 257/40 |
| 5,468,652 | A | * | 11/1995 | Gee .................................. 438/98 |
| 6,011,215 | A | | 1/2000 | Glatfelter et al. |
| 6,239,355 | B1 | | 5/2001 | Salafsky |

FOREIGN PATENT DOCUMENTS

| DE | 43 44 693 A1 | | 6/1994 |
| DE | 198 22 024 A1 | | 11/1999 |
| DE | 198 54 938 A1 | | 6/2000 |
| EP | 0 881 694 A1 | | 12/1998 |
| JP | 02051282 | | 2/1990 |
| WO | 97 10617 | | 3/1997 |
| WO | WO 9949525 | * | 9/1999 |
| WO | 01 59854 | | 8/2001 |

\* cited by examiner

*Primary Examiner* — Jennifer Michener
*Assistant Examiner* — Dustin Q Dam
(74) *Attorney, Agent, or Firm* — Buchanan Ingersoll & Rooney PC

(57) ABSTRACT

Disclosed is a solar cell having at least one photovoltaic layer made of an organic material, in particular a polymer material, which absorbs light and in which electron-hole pairs can be produced, said solar cell having two opposite layer surfaces of which one is connected with at least one hole-receiving layer produced inside said photovoltaic layer and the other is connected with at least one electron-receiving layer produced inside said photovoltaic layer, as well as having electrode areas En and Ep, of which one said electrode area is electrically contacted to said hole-receiving layer and the other said electrode area is electrically connected to said electron receiving layer.

28 Claims, 1 Drawing Sheet

SOLAR CELL WITH ORGANIC MATERIAL IN THE PHOTOVOLTAIC LAYER AND METHOD FOR THE PRODUCTION THEREOF

TECHNICAL FIELD

The present invention relates to a solar cell and method for the production thereof, the solar cell having at least one photovoltaic layer made of an organic material, in particular a polymer material, which absorbs light and in which electron-hole pairs can be produced. The solar cell also comprises two opposite layer surfaces, one of which is connected to at least one layer receiving the holes made in the photovoltaic layer while the other layer surface is connected to at least one layer receiving the electrons produced in the photovoltaic layer. The solar cell further comprises electrode areas, of which one electrode area electrically contacts the layer receiving the holes while the other electrode area electrically contacts the layer receiving the electrons.

THE PRIOR ART

Solar cells of the aforementioned type, which are provided with a layer of organic material, preferably a polymer material instead of a photosensitive layer made of semiconductor material, are presently unable to attain the 20% efficiency customary for conventional solar cells. But rather the efficiency attained with present polymer solar cells is about 2%. However, the new organic solar cells are distinguished by their exceptionally cost-effective materials and production, which makes them increasingly more interesting from an economic vantage point. If the efficiency of polymer solar cells can be improved while keeping production cost-effective respectively making it more cost-effective, the economic attraction of organic solar cells could prevail over conventional solar cells if the purchasing and operating costs are kept lower in relation to the producible electric power of organic solar cells compared to the cost/use ratio of conventional solar cells.

FIG. 2 shows the typical buildup of a polymer solar cell. The solar cell active layer A, in which sunlight is absorbed and electron-pair holes are produced, is made of a mixture of polymers, such as for example PPV, poly-para-phenylene-vinylene or polythiophene derivatives, and fullerene derivatives, such as for example $C_{60}$. To receive the electrons and holes produced in the sunlight absorbing photoactive layer A, layer A is connected to a hole-receiving layer p, which is preferably also made of a polymer such as for example PEDOT, and to an electron-receiving layer n, which is preferably made of LiF. In order to improve conductivity on the "hole side" of the absorption layer A, a light-transparent, electrically conducting ITO layer (doped indium tin oxide) is applied onto the p layer. Finally, a glass plate G serves as a carrier substrate.

Alternative organic materials, preferable polymer materials, suited for use in solar cells having the aforedescribed buildup are described in the article by T. Fromherz et al., in Solar Energy Materials and Solar Cells, vol. 63, pp. 61-68, year 2000.

A metallic, preferably aluminum, electrode En which contacts the n layer, and lateral electrical contacting of the ITO layer serve to electrically contact the aforedescribed prior art solar cell buildup. A decisive drawback of the aforedescribed polymer solar cell is the use of the ITO layer, because ITO itself is expensive and, moreover, is deposited by means of a technically complicated deposition process, for example using PVD (physical vapor deposition), vapor deposition or sputtering processes. The preceding processes all depend on vacuum conditions, whose realization demands costly measures, which makes production expensive. Using an ITO layer, therefore, inevitably is detrimental to the desired goal of producing and providing cost-effective solar cells.

SUMMARY OF THE INVENTION

The object of the present invention is to produce a generic organic solar cell, preferably a polymer solar cell, of as cost-effective as possible materials using technologically simple and thus more cost-effective methods of production, obviating the use of expensive materials and, in addition, attaining at least the efficiency achieved with present polymer solar cells, if not even improving it. The main aim of the invented measures is to produce polymer solar cells taking into account economical considerations and thus to be able to provide alternative economically attractive solar cells which are at least as attractive as conventional solar cells made with semiconductor materials.

The solar cell according to certain aspects of the present invention can be provided with the electron-receiving layer being connected via its electrode area to a flat substrate having a front and a rear side, with the flat substrate having opening structures which project through the front and rear sights laterally.

In a preferred embodiment, the flat substrate is made of a porous material with pores that completely intersperse the flat substrate, for example in the form of a porous plastic foil or a carrier layer made of a textile or cellulose material, such as paper. Furthermore, also feasible is the design of the flat substrate as a surface-treated metal foil subjected to thermal treatment followed by one-sided polishing so that at least one side of the metal surface, namely its front side, is coated with an electrically insulating layer, for example an oxide layer.

Furthermore, the photovoltaic layer and on top of this the hole-receiving layer is applied onto the electron-receiving layer. All the preceding layers applied onto the front side of the flat substrate have layer thicknesses singly or totally so that at least single opening structures project laterally open through the flat substrate and the sequence of layers.

In a first preferred embodiment of the present invention, an electrically conducting, for example by means of doping, strongly hole-conducting layer (hereinafter referred to as $p^{++}$ layer) is applied onto the hole-receiving layer in such a manner that the $p^{++}$ layer material at least partially fills the opening structures projecting laterally through the flat substrate including through the layer buildup down to the rear side of the flat substrate. In this manner, it is ensured that, by corresponding provision of an electrode area applied on the rear side of the flat substrate, the $p^{++}$ layer applied on the front side of the flat substrate can be electrically contacted through to the rear side of the flat substrate.

A second alternative preferred embodiment of the solar cell provides that the hole-receiving layer applied directly onto the photovoltaic layer is itself executed as a $p^{++}$ layer, with the $p^{++}$ layer material, which hitherto preferably completely or at least partially fills the opening structures projecting laterally open through the flat substrate in such a manner that electrical contacting of the $p^{++}$ layer down to the rear side of the flat substrate is possible by means of suited provision of an electrode area on the rear side of the flat substrate.

Both the electrode area connected to the electron-receiving layer and the electrode area connected to the hole-receiving layer are made of metal, preferably aluminum. Due to the rear-side contacting of the invented solar cell, the two electrode areas are located on the layer behind the photovoltaic layer in the radiation direction of the solar cell, thereby completely preventing any shading effects of the electrode areas. It must only be ensured that those layer materials that are borne before the photovoltaic layer in the radiation direction, this relates solely to the hole-receiving layer and the $p^{++}$ layer respectively solely to the $p^{++}$ layer, is permeable to light in order to suffer as few as possible respectively no absorption losses inside the layers borne before the photovoltaic layer. Preferably, the hole-receiving layer, respectively the $p^{++}$ layer, has a light transmission for photovoltaic useable sunlight of at least 50%, preferably 70%, especially preferably 80%. The afore-given transmission values relate to the convolution integral of sunlight intensity (AM1.5) and to the spectral sensitivity of photovoltaic absorber materials of which the photovoltaic layer is built up. Especially suited materials for the holes-receiving layer, respectively the $p^{++}$ layer, are polythiophenes or polythiophene derivatives. An especially preferred material is a Bayer product available under the trademark Baytron®, which relates to 3.4 polyethylene dioxithiophene.

In addition to the requirement that the hole-receiving layer material and the $p^{++}$ layer should be transparent as possible to light in order to transmit the sunlight into the photovoltaic layer with as little loss as possible, there is the requirement that the conductivity of the $p^{++}$ layer material contained in the opening structures to the electrode areas applied onto the rear side of the flat substrate is as high as possible. However, inside the opening structures, the former requirement of as high as possible light transmission plays no role so that conductivity enhancing materials can be selectively added, for example graphite, metals or doped zinc oxides or doped tin oxides, such as antimony or doped tin oxide. Such type materials may, in the extreme case, be completely impermeable to light, however, they possess considerably better electrical conductivity than the at least partially transparent $p^{++}$ layer material.

If, for cost reasons, the preceding conductivity enhancing materials are not added, it is advantageous to render the width respectively the diameter of the opening structures larger than the layer thickness of the hole-receiving layer and the $p^{++}$ layer applied onto the photovoltaic layer. Such a type measure of a reduced as possible layer thickness of the $p^{++}$ layer and, if required, of the hole-receiving layer on the photovoltaic layer and at the same time a wide as possible design of the opening structures partially or completely filled with $p^{++}$ layer material helps, on the one hand, to increase the transmission of the $p^{++}$ layer and, on the other hand, also to raise the conductivity in the longitudinal direction of the opening structures.

In comparison to this, infinite optimization of the conductivity of the material or mixture of materials contained inside the opening structures would be critical with regard to causing local short circuits inside the opening structures between the electrode area for draining electrons located directly on the flat substrate and the $p^{++}$ layer on the photovoltaic layer. Infinite optimization of the conductivity of the $p^{++}$ material over the absorber layer would be analogously critical with regard to causing local short circuits between the electrode area En for draining electrons located directly on the flat surface and the $p^{++}$ layer over the photovoltaic layer outside the opening structures.

An advantage of the buildup of the invented solar cell is, therefore, the insensitivity to the aforedescribed short circuits, respectively to the so-called pinholes. Due to the limited conductivity of the hole-conducting layer, the effect of the local short circuits in the opening structures, respectively outside the opening structures, is not as grave as in solar cells made of better electrically conducting materials. If there is a short circuit between the electrode area, which drains the electrons, on the substrate or on the $p^{++}$ layer over the absorber which drains the holes, the electric current in the invented solar cell must still overcome an additional series resistance corresponding to the conductance through the hole-conducting materials in the opening structures, respectively outside the opening structures. For example, in the case of opening structures with a typical diameter of 10 μm, a typical height respectively length of 100 μm and an electrical conductivity corresponding to the requirements, this resistance corresponds to ($R2=2\times10^4\Omega$ for a square flat element) $60\times10^3\Omega$. If an overall resistance of several parallel short circuits of $1000\Omega$ in the case of an area of 1 cm$^2$ is deemed tolerable, this corresponds to a tolerable short circuit density of 60 per cm$^2$. If, for example, the typical lateral spacing of the opening structures is approximately 100 μm, this corresponds to approximately one short circuit per 167 openings. If, for example, the typical lateral spacing of the opening structures is 10 μm, this corresponds to approximately one short circuit per two openings. Accordingly, a tolerable short circuit density of 600 per cm$^2$ for $R2=2\times10^5\Omega$, 24 per cm$^2$ for $R2=8\times10^3\Omega$, 6 per cm$^2$ for $R2=2\times10^3\Omega$.

Another aspect of an as optimized as possible geometrical and electrical design of the solar cell relates to the requirement that the ohmic drop in the longitudinal direction of the opening structures caused by the irradiation of the solar cell should be much smaller than the operating voltage of the solar cell at the operating point at which solar cell power is at a maximum. Preferably, the ohmic drop in the longitudinal direction of the opening structures should amount to less than 5% of the solar cell voltage at the operating point of maximum power. Derived from this are, on the one hand, certain values and presets for the electrical resistance of the $p^{++}$ layer in the radiation direction before the photovoltaic layer as well as for the corresponding materials inside the opening structures and, on the other hand, the presets of the geometrical arrangement and design of the single opening structures inside the flat substrate. For further details see the description with reference to the preferred embodiments.

Furthermore, an invented method for producing a solar cell having at least one photovoltaic layer of the aforementioned type made of an organic material, in particular a polymer material, is described which is distinguished by the following process steps: in a first step, a flat substrate having a front side and a rear side, as described in the preceding, which, in particular, disposes of opening structures which completely project through the flat substrate from its front side to its rear side, is provided. The flat substrate is provided with an electrode area on one side, namely its front side, in that the front side of the flat substrate is metallized. The metallization process occurs, for example, as part of a wet-chemical process, for example in a steep bath. Likewise, the two-dimensional metallization can occur as part of a vapor deposition or sputtering process.

In order to prevent coating, respectively metallization, of the rear side of the flat substrate, it must be protected against the metallization process. For example, a protective foil, which can be easily removed again from the rear side, can be placed on the rear side of the flat substrate.

After completed metallization of the front side of the flat substrate, an electron-selective layer is applied two-dimensionally onto the deposited electrode area, which receives electrons well but receives holes poorly and transmits them to the metal. Especially suited, for example, for this purpose is a very thin LIF layer or bathophenantrolin doped with Al or Cs.

This layer too can be applied by means of conventional vapor deposition or using a wet-chemical process.

A photovoltaic layer, the so-called absorber layer, which preferably is made of a mixture of a fullerene derivative and a PPV-polymer, is now deposited on the electron-selective layer. Fundamentally, alternative organic materials, in particular polymer photovoltaic materials, such as for example found in T. Fromherz's article mentioned in the preceding, can also be employed.

In a first alternative variant of the method, a p-conducting layer, for example made of polythiophene derivatives, which can receive holes well but electrons poorly, can be applied onto the deposited absorber layer, which, moreover, can be applied by way of a steep bath to keep production costs low. Finally, a strongly doped $p^{++}$ layer, for example made of polythiophene derivatives which conducts holes well is applied onto this layer in such a manner that the strongly doped $p^{++}$ material layer, which preferably completely fills the opening structures laterally interspersing the flat substrate and penetrates through the respective opening structures onto the rear side of the flat substrate.

In this manner, electrical contacting through of the solar cell from the front side to the rear side of the flat substrate is achieved in such a way that shading of the photovoltaic active layer of the solar cell by the electrode areas is avoided. Moreover, pastes, varnishes or solutions that buildup an electrically conducting layer are suited to improve the electrical contacting projecting through the opening structures to the rear side of the flat substrate. Such type substances are preferably applied to the rear side of the flat substrate and pressed into the present opening structures, respectively pores, after the protective foil mentioned in the preceding has been removed from the rear side of the flat substrate.

Based on the aforementioned deposition process for producing the photovoltaic layer, in a second alternative method the $p^{++}$ layer which, as mentioned in the preceding, is able to at least partially penetrate into the opening structures in order to realize in this manner rear side contacting, is applied directly onto the photovoltaic layer.

Finally, the aim is, independent of the two aforementioned method variants, to provide the rear side of the flat substrate with a metal layer which serves as the electrode area for the $p^{++}$ layer. Application of the metal layer on the rear side of the flat substrate is preferably by means of vapor deposition or in particular gluing on a metal foil with a conductive adhesive as the contact medium. This metallization has, apart from an electrical conducting function, a barrier function against impurities, such as for example oxygen or water, entering the solar cell system from the rear side.

In a preferred embodiment, it is feasible that thin ITO layers or other inorganic transparent, electrically conductive layers are vapor deposited or sputtered onto the $p^{++}$ layer. In order to take the cost factor into account, these additional layers can be selected relatively thin due to their electrical contacting through the flat substrate.

The aforementioned process steps to apply the single layers on a flat substrate which has a porous structure and which preferably itself possesses elastic properties is preferably produced by means of a so-called "roll-to-roll coating process". In this process, the flat substrate is drawn through single wet-chemical steep baths by means of which corresponding layer deposition occurs. The decisive coating parameter is the speed with which the to-be-coated flat substrate is drawn through the single steep baths and by means of which the single layer thicknesses can be determined.

Fundamentally, the aforedescribed organic solar cell can also be designed in such a manner that the n layers and the p layers can be exchanged. Correspondingly, a strongly electron-conducting layer, for example by means of doping, should be called $n^{++}$ and $p^{++}$ and are correspondingly exchanged.

BRIEF DESCRIPTION OF THE DRAWING

The present invention is made more apparent in the following using preferred embodiments with reference to the accompanying drawings in the following without the intention of limiting the scope or spirit of the overall inventive idea. Depicted is in.

WAYS TO CARRY OUT THE INVENTION

Commercial Applicability

Figure 1:
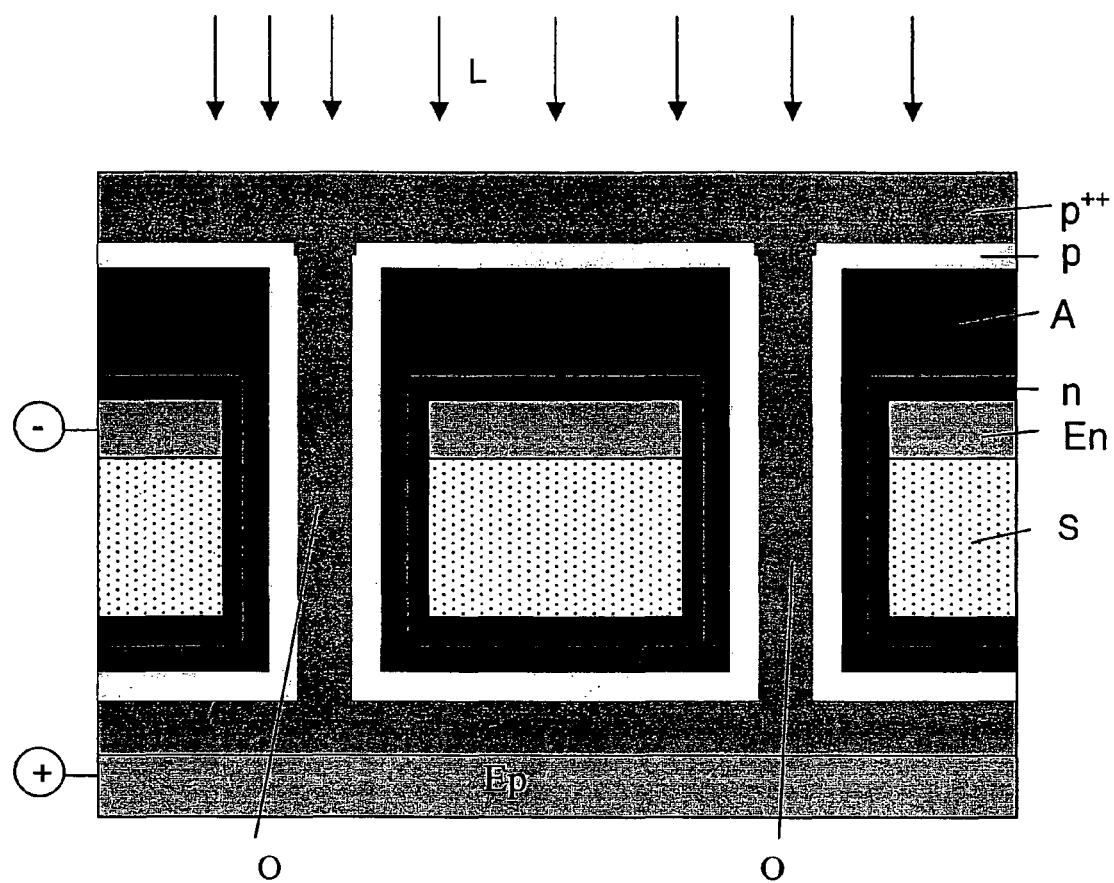
FIG. 1 a schematic cross section of the sequence of layers of a solar cell designed according to the present invention, and FIG. 2 a schematic cross section of a prior art organic solar cell.
Figure 2:
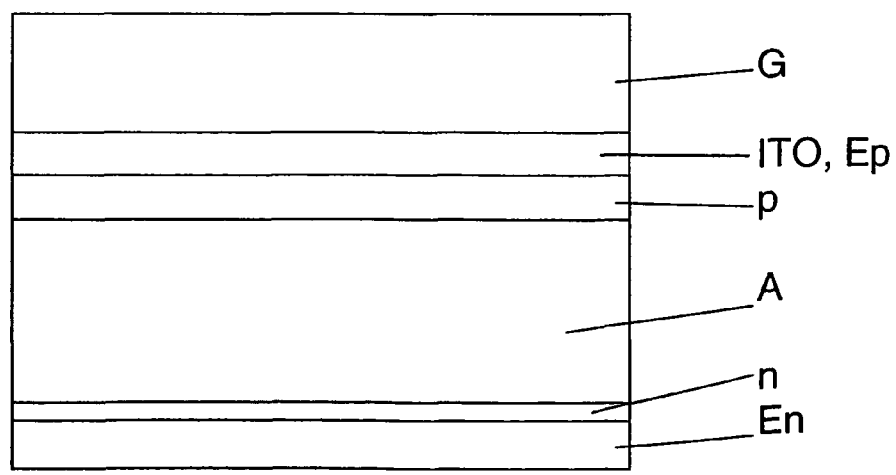

FIG. 1 shows a cross section of a solar cell designed according to the present invention having a flat substrate S, which has a porous structure and which is provided with opening structures O which project through it laterally. A multiplicity of such type opening structures project completely through the flat substrate S from its front side to its rear side. As already mentioned suited as a porous flat substrate are paper, porous plastic foil or even surface-treated metal foils.

An electrode area En, which is designed as a metal layer and acts as a cathode for the solar cell described herein, is applied onto the front side of the flat substrate S. Furthermore, an electron-receiving layer n, which at least completely covers the electrode area En is provided, and which, for example due to wet-chemical coating process, can cover the entire surface of the electrode area En as well as the flat surface S. As already mentioned in the preceding, layer deposition occurs by way of a steep bath, in that the entire free surfaces is wetted with the to-be-deposited layer material. The n layer is preferably made of LIF. In a further method process, the photovoltaic layer A, on which a hole-receiving layer p is provided which for its part is covered by a $p^{++}$ layer, is deposited on this n layer.

An essential aspect of the organic solar cell designed according to the present invention is the through contacting of the $p^{++}$ layer laterally through the entire layer buildup through the opening structures O through to the rear side of the solar cell, which is provided with another electrode area Ep, the anode.

Light L impinging on the front side of the solar cell penetrates the practically transparent layers $p^{++}$ and p and enters the photovoltaic absorber layer A, in which the electron/hole pairs are formed. The electrons enter the electrode area En via the n layer and thus form the cathode of the solar cell. On the other hand, the holes separated inside the photovoltaic layer A enter the $p^{++}$ layer via the layer p and reach, via the opening structures O, the electrode area Ep, which forms the anode of the solar cell.

As the light transmission of the $p^{++}$ layer material plays no role in the longitudinal direction of the opening structures O, additives can be added to the $p^{++}$ layer material in this region, thereby raising hole conductivity. Such type additives are, for example, graphite, metals or doped zinc oxides or doped tin oxides, such as antimony, doped tin oxide or the like.

Furthermore, R1 is the electric resistance of a square area element of the $p^{++}$ layer on the photovoltaic layer A, whereas R2 is the electric resistance of a square area element of the material contained inside the opening structures. Ld is the average space between two opening structures, with h being the typical thickness of the flat substrate and therefore being approximately the typical length of the opening structures, b is the typical diameter of the openings and I is the typical irradiation strength of the light impinging on the organic solar cell.

If the ohmic drop in the longitudinal direction of the opening structure is smaller than 5% of the voltage of the organic solar cell at the operating point of maximum power, at the so-called maximum power point, the following are the values of and apply for the preceding parameters: Ld=100 µm, b=10 µm, h=100 µm and I=1000 W/m², consequently for the resistances R1 and R2: R1<$2\times10^5$ Ω and R2<$2\times10^4$ Ω.

As, for practical reasons, the lateral space between two opening structures is noticeably larger than the diameter of the opening structures, the maximum tolerable value of R1 is larger than that of R2 if the diameter of the openings is smaller than the thickness of the flat substrate respectively the length of the openings. Correspondingly advantageous is providing a thicker material than the $p^{++}$ layer or another material on the absorber and therefore providing a lower resistance in the openings. The preferred values of the preceding parameters are given in the following table:

| Ld (µm) | b (µm) | H (µm) | I (W/m²) | R1 (Ω) | R2 (Ω) |
|---|---|---|---|---|---|
| 500 | 100 | 100 | 1000 | $5 \times 10^6$ | $8 \times 10^3$ |
| 500 | 10 | 100 | 1000 | $5 \times 10^6$ | $8 \times 10^2$ |
| 100 | 1 | 100 | 1000 | $2 \times 10^5$ | $2 \times 10^3$ |
| 30 | 3 | 100 | 1000 | $2 \times 10^6$ | $6 \times 10^4$ |
| 10 | 1 | 100 | 1000 | $2 \times 10^7$ | $2 \times 10^5$ |
| 10 | 0.1 | 100 | 1000 | $2 \times 10^7$ | $2 \times 10^4$ |

Preferred fields of application of the solar cell according to the present invention are, on the one hand, the irradiation of solar cells with high light intensities, such as for example occur in the case of direct sun irradiation. Light intensities between 100 W/m² and 1000 W/m² are quite typical for external applications. On the other hand, the solar cell performs remarkably well at low light intensities, for example in indirect sun irradiation or irradiation with artificial light, for instance in interior applications with light intensities of less than 100 W/m². In addition, low irradiation intensities reduce the demands on the electric conductivity of the single layers of the solar cell system.

What is claimed is:

1. A solar cell having at least one photovoltaic layer made of an organic material which absorbs light and in which electron-hole pairs can be produced, said at least one photovoltaic layer having two opposite layer surfaces of which one is connected with at least one hole-receiving layer for receiving holes produced inside said photovoltaic layer and the other is connected with at least one electron-receiving layer for receiving electrons produced inside said photovoltaic layer, said photovoltaic layer made from a material that differs from the at least one hole-receiving layer and from the at least one electron receiving layer, as well as having electrode areas, of which one said electrode area is electrically connected to said at least one hole-receiving layer and the other said electrode area is electrically connected to said at least one electron receiving layer, wherein said at least one electron-receiving layer is connected via an electrode area to a flat substrate having a front side and a rear side, said flat substrate is provided with opening structures projecting from said front side through the substrate to said rear side, said at least one hole-receiving layer, said photovoltaic layer, said electron-receiving layer and said electrode area connected to said at least one electron receiving layer are applied on said front side of said flat substrate in such a manner that at least one of said opening structures project laterally through said substrate and through said electrode area, the at least one electron-receiving layer, the photovoltaic layer, and the at least one hole-receiving layer, an electrically conducting $p^{++}$ layer is applied onto said at least one hole-receiving layer or said at lest one hole-receiving layer is designed as a $p^{++}$ layer, which at least partially fills said at least one opening structure and extends through said at least one opening structure, and extends through said flat substrate to said rear side of said flat substrate, and said electrode area for receiving said at least one hole-receiving layer is provided on said rear side of said flat substrate, said electrode area being electrically contacted to said $p^{++}$ layer reaching through said at least one opening structure.

2. The solar cell according to claim 1, wherein a hole-conducting material, which has better electrical conductivity than the material of said $p^{++}$ layer, is contained inside the at least one opening structure.

3. The solar cell according to claim 1, wherein the electrical conductivity of said hole-conducting material inside said opening structures is selected so that possible short circuits inside said opening structures between said electron-receiving electrode area and said $p^{++}$ layer do not significantly impair the short circuit current and/or the efficiency of said solar cell.

4. The solar cell according to claim 1, wherein the electrical conductivity of said hole-conducting material outside said opening structures is selected so that possible short circuits outside said opening structures between said electron-receiving electrode area and said $p^{++}$ layer do not significantly impair the short circuit current and/or the efficiency of said solar cell.

5. The solar cell according to claim 1, wherein said electrode areas are designed as metal layers.

6. The solar cell according to claim 1, wherein said $p^{++}$ layer has a maximum electrical resistance of $10^6$ Ω.

7. The solar cell according to claim 1, wherein said $p^{++}$ layer has a light transmission for photovoltaic useable sunlight of at least 50%.

8. The solar cell according to claim 1, wherein said doped $p^{++}$ layer contains polythiophenes or polythiophene derivatives.

9. The solar cell according to claim 1, wherein the hole-conducting $p^{++}$ layer material introduced inside said opening structures contains graphite, metals or doped zinc oxides or doped tin oxides, such as antimony-doped tin oxide or aluminum-doped zinc oxide.

10. The solar cell according to claim 1, wherein said substrate is made of a porous material having pores which form said opening structures projecting laterally through said substrate.

11. The solar cell according to claim 1, wherein
said opening structures have opening diameters of 1 to 10 µm and adjacent said opening structures are spaced 10 to 100 µm apart, or said opening structures have opening diameters of 0.1 to 1 µm and adjacent said opening structures are spaced 1 to 10 µm apart, or said opening structures have opening diameters of 10 to 100 µm and adjacent said opening structures are spaced between 100 to 500 µm apart, or said opening structures have opening diameters of 5 to 25 µm and adjacent said opening structures are spaced between 25 and 100 µm apart.

12. The solar cell according to claim 1, wherein the present sequence of layers on said front side of said substrate comprising said electrode area, said electron-receiving layer, said photovoltaic layer have an overall thickness which is less than half of the opening diameter of said opening structures or in case a $p^{++}$ layer is provided in addition to said hole-receiving layer, the thickness of said hole-receiving layer must be taken into account in said overall layer thickness.

13. The solar cell according to claim 1, wherein said substrate is made of a porous plastic, textile or cellulose material, such as paper, or a surface-treated metal foil.

14. The solar cell according to claim 1, wherein said surface substrate material is elastic.

15. The solar cell according to claim 1, wherein said photovoltaic layer contains polymer material or polymer material compounds.

16. The solar cell according to claim 1, wherein said photovoltaic layer contains a mixture of a fullerene derivative and a PPV polymer.

17. The solar cell according to claim 1, wherein said electron-receiving layer is a LiF layer or an Al-doped or Cs-doped bathophenanthroline layer.

18. The solar cell according to claim 1, wherein said electrode areas are made of aluminum.

19. The solar cell according to claim 1, wherein the organic material comprises a polymer.

20. The solar cell according to claim 1, wherein said at least one electron receiving layer encapsulates said electrode area that is electrically connected to said at least one electron receiving layer, as well as said flat substrate.

21. The solar cell according to claim 20, wherein said at least one photovoltaic layer encapsulates said at least one electron receiving layer.

22. The solar cell according to claim 21, wherein said at least one hole-receiving layer encapsulates said at least one photovoltaic layer.

23. A solar cell having at least one photovoltaic layer made of an organic material which absorbs light and in which electron-hole pairs can be produced, said at least one photovoltaic layer having two opposite layer surfaces of which one is connected with at least one hole-receiving layer for receiving holes produced inside said photovoltaic layer and the other is connected with at least one electron-receiving layer for receiving electrons produced inside said photovoltaic layer, said photovoltaic layer made from a material that differs from the at least one hole-receiving layer and from the at least one electron receiving layer, as well as having electrode areas, of which one said electrode area is electrically connected to said at least one hole-receiving layer and the other said electrode area is electrically connected to said at least one electron receiving layer, wherein said at least one hole-receiving layer is connected via its electrode area to a flat substrate having a front side and a rear side, said flat substrate has opening structures projecting laterally through from said front side to said rear side, said at least one electron-receiving layer, said at least one photovoltaic layer, said at least one hole-receiving layer, and said electrode area connected to said at least one hole-receiving layer are applied onto said front side of said flat substrate in such a manner that said opening structures project laterally through said flat substrate and through said layers, an electrically conducting $n^{++}$ layer is applied onto said at least one electron-receiving layer, or said at least one electron-receiving layer comprises a $n^{++}$ layer which at least partially fills said opening structures projecting laterally through said flat substrate to said rear side of said flat substrate, and said electrode area for said at least one electron-receiving layer is provided on said rear side of said flat surface, said electrode area being electrically contacted to said $n^{++}$ layer reaching through said opening structures.

24. The solar cell according to claim 23, wherein said at least one electron receiving layer encapsulates said electrode area that is electrically connected to said at least one electron receiving layer, as well as said flat substrate.

25. The solar cell according to claim 24, wherein said photovoltaic layer encapsulates said at least one electron receiving layer.

26. The solar cell according to claim 25, wherein said hole-receiving layer encapsulates said at least one photovoltaic layer.

27. The solar cell of claim 1, wherein the entire substrate is disposed below the photovoltaic layer.

28. The solar cell of claim 23, wherein the entire substrate is disposed below the photovoltaic layer.

* * * * *